(12) United States Patent
Yoon et al.

(10) Patent No.: US 10,359,456 B2
(45) Date of Patent: Jul. 23, 2019

(54) MULTICHANNEL FUEL CELL TEST STATION

(71) Applicant: KOREA INSTITUTE OF ENERGY RESEARCH, Daejeon (KR)

(72) Inventors: Young Gi Yoon, Daejeon (KR); Young Woo Choi, Chungcheongbuk-do (KR); Tae Young Kim, Jeollabuk-do (KR); Beom Jun Kim, Jeollabuk-do (KR); Min Ho Seo, Gyeonggi-do (KR); Jong Min Lee, Jeollabuk-do (KR); Chi Young Jung, Gyeonggi-do (KR)

(73) Assignee: Korea Institute of Energy Research, Daejeon (KR)

( * ) Notice: Subject to any disclaimer, the term of this patent is extended or adjusted under 35 U.S.C. 154(b) by 9 days.

(21) Appl. No.: 15/695,894

(22) Filed: Sep. 5, 2017

(65) Prior Publication Data

US 2018/0210019 A1    Jul. 26, 2018

(30) Foreign Application Priority Data

Jan. 20, 2017  (KR) ........................ 10-2017-0009724

(51) Int. Cl.
*G01R 27/26*  (2006.01)
*G01R 31/385*  (2019.01)
(Continued)

(52) U.S. Cl.
CPC ....... *G01R 27/2617* (2013.01); *G01R 31/385* (2019.01); *H01M 8/04641* (2013.01);
(Continued)

(58) Field of Classification Search
CPC ........... G01R 27/2617; G01R 31/3627; H01M 2008/1095; H01M 8/04828; H01M 8/04388; H01M 8/2457; H01M 8/0432
(Continued)

(56) References Cited

U.S. PATENT DOCUMENTS

| 6,715,743 | B2 * | 4/2004 | Zhang | ............... H01M 8/04223 |
| | | | | 261/130 |
| 2006/0115693 | A1 * | 6/2006 | Toth | ..................... G01R 31/386 |
| | | | | 429/413 |
| 2010/0253357 | A1 * | 10/2010 | Seo | .................. G01R 19/16542 |
| | | | | 324/427 |

FOREIGN PATENT DOCUMENTS

| JP | 20070529854 A | 10/2007 |
| JP | 2009 121557 A | 6/2009 |

(Continued)

*Primary Examiner* — Farhana A Hoque
(74) *Attorney, Agent, or Firm* — Sandberg Phoenix & von Gontard PC

(57) ABSTRACT

A multichannel fuel cell test station for testing a performance of a fuel cell membrane electrode assembly (MEA) is provided. The multichannel fuel cell test station may include a cell mounting portion configured to receive a plurality of unit cells, a gas supply configured to supply fuel gas to the unit cells and including a pressure generator and a mass flow controller (MFC), a temperature controller configured to maintain a constant ambient temperature of the unit cells, a humidifying portion configured to maintain a constant humidification state around the unit cells, a measurer configured to measure performances and electrochemical impedances of the unit cells, and a controller configured to control the gas supply, the temperature controller, the humidifying portion and the measurer.

10 Claims, 4 Drawing Sheets

(51) Int. Cl.
*H01M 8/0432* (2016.01)
*H01M 8/0438* (2016.01)
*H01M 8/1018* (2016.01)
*H01M 8/2457* (2016.01)
*H01M 8/04119* (2016.01)
*H01M 8/04537* (2016.01)
*H01M 8/04664* (2016.01)
*H01M 8/04701* (2016.01)
*H01M 8/04746* (2016.01)
*H01M 8/04828* (2016.01)

(52) U.S. Cl.
CPC ... *H01M 8/04664* (2013.01); *H01M 8/04731* (2013.01); *H01M 8/04753* (2013.01); *H01M 8/04828* (2013.01); *H01M 8/0432* (2013.01); *H01M 8/04119* (2013.01); *H01M 8/04388* (2013.01); *H01M 8/2457* (2016.02); *H01M 2008/1095* (2013.01)

(58) Field of Classification Search
USPC .......................................... 324/432; 429/413
See application file for complete search history.

(56) References Cited

FOREIGN PATENT DOCUMENTS

| | | |
|---|---|---|
| KR | 100591441 A | 6/2006 |
| KR | 10-081195 A | 3/2008 |
| KR | 10 0811985 B | 10/2008 |
| KR | 10 2012 0117171 A | 10/2012 |

\* cited by examiner

MULTICHANNEL FUEL CELL TEST STATION

CROSS-REFERENCE TO RELATED APPLICATION

This application claims the benefit of Korean Patent Application No. 10-2017-0009724, filed on Jan. 20, 2017, in the Korean Intellectual Property Office, the disclosure of which is incorporated herein by reference.

BACKGROUND

1. Field of the Invention

At least one example embodiment relates to a performance test technology of a fuel cell membrane electrode assembly (MEA), and more particularly, to a multichannel fuel cell test station that may test performances of a plurality of unit fuel cells and a multichannel fuel cell test method using the multichannel fuel cell test station.

2. Description of the Related Art

A fuel cell is an electricity generation system that directly converts fuel energy into electric energy and is advantageous in low emission and high efficiency. In particular, the fuel cell is gaining attention as a next-generation energy source, because the fuel cell generates electric energy using an energy source, for example, petroleum, natural gas or methanol, that is easily stored and transported. Fuel cells are divided into phosphoric acid fuel cells, molten carbonate fuel cells, solid oxide fuel cells, polymer electrolyte fuel cells, alkaline fuel cells, and the like, based on types of used electrolytes. The above fuel cells may operate basically based on the same principle, however, may be different from each other in a type of fuel to be used, an operation temperature, a catalyst, an electrolyte, and the like.

A polymer electrolyte fuel cell uses, as an electrolyte, a polymer membrane that conducts a hydrogen ion (or a proton), and includes, in a unit cell, a polymer electrolyte membrane and a membrane electrode assembly (MEA) including an anode and a cathode that are located on both sides of the polymer electrolyte membrane. Typically, the polymer electrolyte fuel cell is prepared with a stack structure in which a plurality of unit cells and bipolar plates (BP) including a flow path to supply an oxidizer and fuel to the unit cells, are alternately stacked. A direct methanol fuel cell configured to directly supply liquid fuel to an anode, in addition to the above-described polymer electrolyte fuel cell, may be used as a fuel cell that uses, as an electrolyte, a polymer membrane that conducts a hydrogen ion. Since the direct methanol fuel cell does not use a fuel processor and operates at an operation temperature less than 100° C., the direct methanol fuel cell is advantageously suitable for a structure of a portable or compact fuel cell.

To form a fuel cell stack, a performance of a unit fuel cell may need to be tested prior to forming of the fuel cell stack. For example, when performances of unit cells are not tested and a fuel cell stack is formed, the fuel cell stack may be found to be defective due to a defect of a specific MEA. In this example, the fuel cell stack may be disassembled and a process and costs for replacing a defective unit fuel cell may be considerably required.

In an apparatus and method for testing a performance of a unit fuel cell according to a related art, a scheme of applying individual performance test stations for each unit cell to test a performance is basically used. However, when the scheme is used, a very long period of time is required to test a performance of each of a plurality of unit fuel cells included in each of fuel cell stacks, and a lot of maintenance manpower and a wide installation area are required, which results in an increase in costs required for a performance test.

SUMMARY

The present disclosure is to solve the foregoing problems, and an aspect provides a multichannel fuel cell test station (*station that may test performances of a plurality of unit cells using a single performance test station and that may be suitable for a mass production of a fuel cell stack).

According to an aspect, there is provided a multichannel fuel cell test station including a cell mounting portion configured to receive a plurality of unit cells, a gas supply configured to supply fuel gas to the unit cells and including a pressure generator and a mass flow controller (MFC), a temperature controller configured to maintain a constant ambient temperature of the unit cells, a humidifying portion configured to maintain a constant humidification state around the unit cells, a measurer configured to measure performances and electrochemical impedances of the unit cells, and a controller configured to control the gas supply, the temperature controller, the humidifying portion and the measurer.

The same number of pressure generators as a number of the unit cells, and a single MFC may be provided.

The pressure generator may be formed in a front end of each of the unit cells. The pressure generator may include a top plate including an inlet and an outlet penetrating through the pressure generator, and a bottom plate including a flow path formed to allow the fuel gas to move. In the pressure generator, the inlet may be connected to an end of the flow path, the outlet may be connected to another end of the flow path, and the fuel gas may flow from the inlet to the outlet by passing through the flow path.

A pressure of the fuel gas at the end may be higher than a pressure of the fuel gas at the other end.

The flow path may include a zigzag groove formed between the ends.

The gas supply may be configured to supply gas including at least one of air, hydrogen, nitrogen and oxygen.

The measurer may include a magnetic contactor.

The measurer may include an electrochemical impedance device and a single unit cell performance measurement device.

The humidifying portion may include an air humidifier. The air humidifier may include a water supply, a dry gas supply, a porous bubble generator, a bubble blocking wall and a wet gas discharge portion.

According to another aspect, there is provided a multichannel fuel cell test method of simultaneously measuring performances and electrochemical impedances of "2" through "12" unit cells using the multichannel fuel cell test station.

Additional aspects of example embodiments will be set forth in part in the description which follows and, in part, will be apparent from the description, or may be learned by practice of the disclosure.

BRIEF DESCRIPTION OF THE DRAWINGS

These and/or other aspects, features, and advantages of the invention will become apparent and more readily appreciated from the following description of example embodiments, taken in conjunction with the accompanying drawings of which.

DETAILED DESCRIPTION

Figure 1:
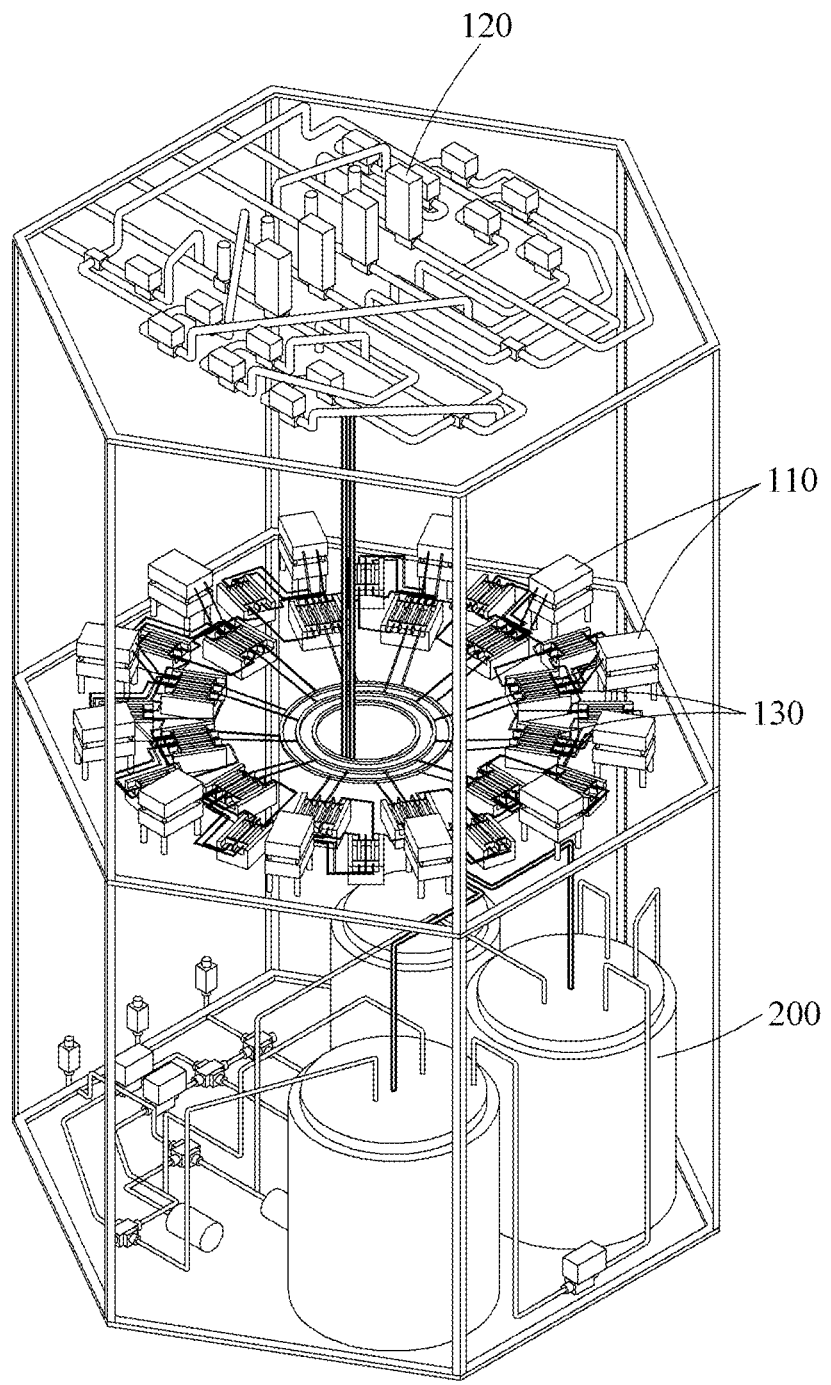
FIG. 1 is a diagram illustrating a designed structure of a multichannel fuel cell test station according to an example embodiment.

Hereinafter, example embodiments of the present disclosure will be described in detail with reference to the accompanying drawings.

Various modifications may be made to the example embodiments. The example embodiments are not construed as limited to the disclosure and should be understood to include all changes, equivalents, and replacements within the idea and the technical scope of the disclosure.

The terminology used herein is for the purpose of describing particular example embodiments only and is not intended to be limiting of example embodiments. As used herein, the singular forms are intended to include the plural forms as well, unless the context clearly indicates otherwise. It should be further understood that the terms "comprises" and/or "comprising," when used in this specification, specify the presence of stated features, integers, steps, operations, elements, components or a combination thereof, but do not preclude the presence or addition of one or more other features, integers, steps, operations, elements, components, and/or groups thereof.

Unless otherwise defined herein, all terms used herein including technical or scientific terms have the same meanings as those generally understood by one of ordinary skill in the art. Terms defined in dictionaries generally used should be construed to have meanings matching with contextual meanings in the related art and are not to be construed as an ideal or excessively formal meaning unless otherwise defined herein.

Regarding the reference numerals assigned to components in the drawings, it should be noted that the same components will be designated by the same reference numerals, wherever possible, even though they are shown in different drawings. Also, in describing of example embodiments, detailed description of well-known related structures or functions will be omitted when it is deemed that such description will cause ambiguous interpretation of the present disclosure.

FIG. 1 is a diagram illustrating a designed structure of a multichannel fuel cell test station according to an example embodiment.

Referring to FIG. 1, the multichannel fuel cell test station includes a cell mounting portion 110, a gas supply, a temperature controller, a humidifying portion 200, a measurer, and a controller. The cell 110 mounting portion may receive a plurality of unit cells. The gas supply may supply gas to the unit cells and may include a pressure generator and a mass flow controller (MFC) 120. The temperature controller may maintain a constant ambient temperature of the unit cells. The humidifying portion 200 may maintain a constant humidification state around the unit cells. The measurer may measure performances and electrochemical impedances of the unit cells. The controller may control the gas supply, the temperature controller, the humidifying portion 200 and the measurer.

In the present disclosure, a unit cell may refer to a collector that is required to test a performance of a fuel cell and that includes a membrane electrode assembly (MEA) and a catalyst included in the fuel cell. The unit cell may include a flow path plate and a frame, and may be formed to supply air and hydrogen to the MEA. Also, the unit cell may have a structure in which generated electricity is collected and in which a gas tightness is maintained.

The plurality of unit cells may be mounted in the multichannel fuel cell test station, and accordingly it is possible to measure performances of the plurality of unit cells using a single multichannel fuel cell test station. The multichannel fuel cell test station may include the cell 110 mounting portion to receive the plurality of unit cells, as described above.

The gas supply may include the pressure generator and the MFC 120. The gas supply may have all structures for supplying fuel gas, for example, hydrogen, nitrogen, oxygen, mixed gas or air, however, there is no limitation to the structures.

To exhibit a stable performance during a driving process, a constant ambient temperature of a unit cell may need to be maintained. The temperature controller may include a heater and a cooler, to maintain a constant ambient temperature of a unit cell.

A performance of a unit fuel cell may greatly vary depending on a degree of humidification. To prevent a performance of a fuel cell from decreasing based on a change in relative humidity during testing of a performance of the fuel cell and to verify the performance, the humidifying portion may include a humidifier that is configured to maintain a constant humidification state and to adjust relative humidity.

In the multichannel fuel cell test station, the measurer may measure the performances and electrochemical impedances of the unit cells. The performances and electrochemical impedances of the unit cells may be measured individually using separate devices. The separate devices may be included in the multichannel fuel cell test station.

The measurer may measure an electrochemical impedance of a single unit cell using an electrochemical impedance device while measuring a performance of another unit cell.

Since gas reacted with the unit cells contains moisture, the multichannel fuel cell test station may further include a discharge portion configured to condense and remove the gas.

The controller may control an overall operation of the multichannel fuel cell test station, may supply required power and may extract a performance test result of each of the unit cells.

The gas supply may include the pressure generator and the MFC 120. A performance test station according to a related art has constraints on space and costs required to test a performance of a fuel cell because a high-priced MFC is used for each unit cell for a distribution of a gas flowing amount. On the other hand, according to an example embodiment, a pressure generator may be introduced to enable a uniform gas flowing amount distribution of a plurality of unit cells, and thus it is possible to implement an effect of testing performances of a plurality of unit fuel cells using a test station including a single MFC.

For example, a number of pressure generators may be the same as a number of the unit cells, and a single MFC may be provided.

The pressure generator may function to drop a pressure of fuel gas, and as a result, the multichannel fuel cell test station may uniformly distribute a fuel gas flow to the plurality of unit cells. Thus, by introducing the pressure generator, performances of a plurality of unit cells may be tested using a single MFC.

The pressure generator may be formed in a front end of each of the unit cells.

Because the pressure generator is formed in a front end of each of the unit cells, a relatively high and uniform pressure may drop, which may lead to a uniform gas flow to the plurality of unit cells.

Figure 2:
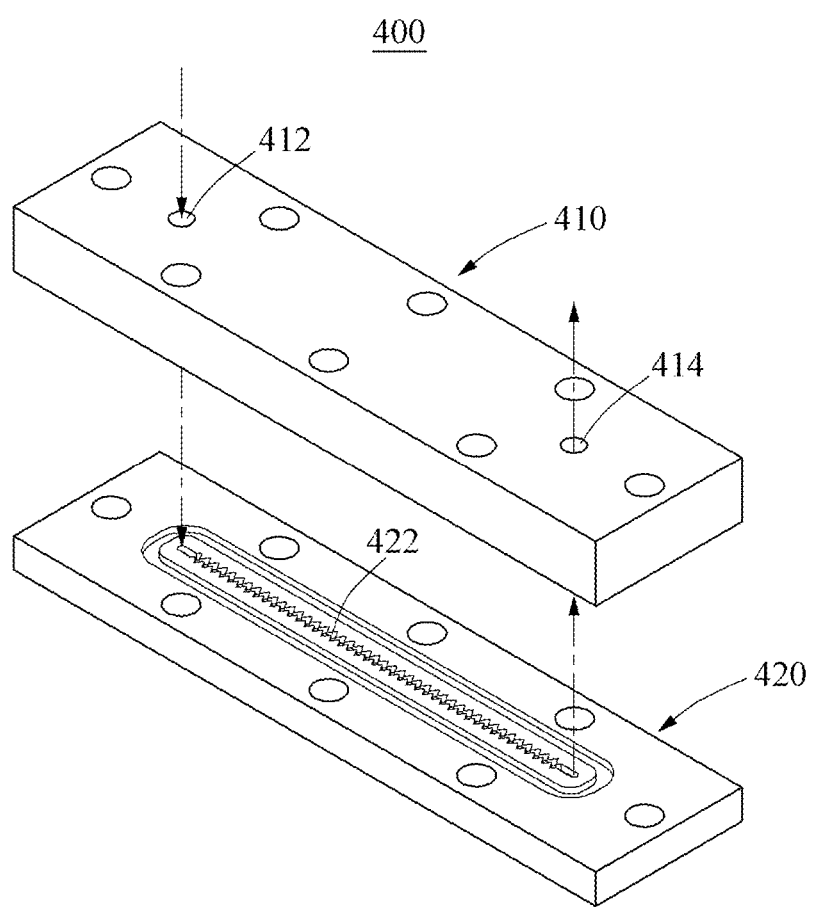
FIG. 2 is a diagram illustrating a structure of a pressure generator applied to a multichannel fuel cell test station according to an example embodiment.

FIG. 2 is a diagram illustrating a structure of a pressure generator 400 applied to a multichannel fuel cell test station according to an example embodiment.

Referring to FIG. 2, the pressure generator 400 may include a top plate 410 and a bottom plate 420. The top plate 410 may include an inlet 412 and an outlet 414 that penetrate through the pressure generator 400. The bottom plate 420 may include a flow path 422 formed to allow fuel gas to move. The pressure generator 400 may have a structure in which the inlet 412 is connected to an end of the flow path 422 and the outlet 414 is connected to another end of the flow path 422 so that the fuel gas flows from the inlet 412 to the outlet 414 by passing through the flow path 422.

For example, the pressure generator 400 may have a shape of a chamber with an internal space. In this example, a structure to inject the fuel gas by connecting the inlet 412 of the top plate 410 to an end of the flow path 422 of the bottom plate 420, and a structure to allow the fuel gas to be discharged by connecting the outlet 414 of the top plate 410 to another end of the flow path 422 of the bottom plate 420 may be formed between the top plate 410 and the bottom plate 420.

Also, a pressure of the fuel gas at the end may be higher than a pressure of the fuel gas at the other end.

The pressure of the fuel gas may be reduced while the fuel gas passes through the flow path 422 from the end connected to the inlet 412.

The flow path may include a zigzag groove formed between the ends.

Since the zigzag groove is formed, the pressure of the fuel gas may drop due to a friction to a corner portion of the zigzag groove even though a specific device is not provided.

The gas supply may supply gas that includes at least one of air, hydrogen, nitrogen, oxygen and water vapor. The above gas may be used as a raw material to generate electricity in a unit cell. For example, air, hydrogen and oxygen may function as an oxidizer and fuel of an electrochemical reaction, and nitrogen and water vapor may function to perform purging and humidification.

Referring back to FIG. 1, the measurer may include a magnetic contactor 130.

When a plurality of unit cells are connected and a signal is received from the controller, the magnetic contactor 130 may measure an electrochemical impedance of a single unit cell while measuring a performance of another unit cell.

Figure 3:
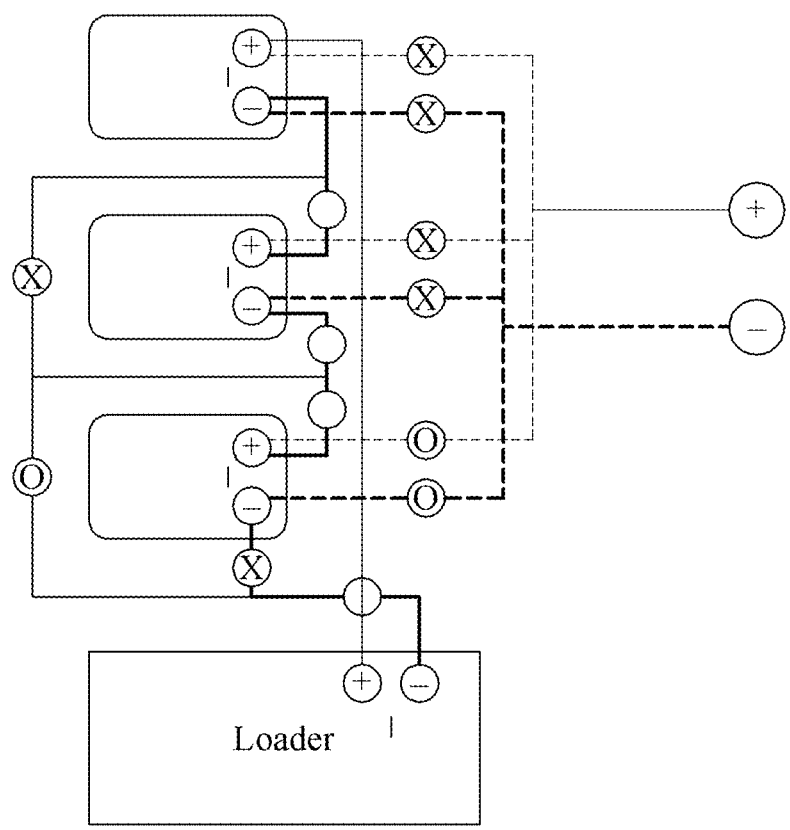
FIG. 3 is a diagram illustrating an electrochemical impedance measurement scheme of a multichannel fuel cell test station according to an example embodiment.

FIG. 3 is a diagram illustrating an electrochemical impedance measurement scheme of a multichannel fuel cell test station according to an example embodiment.

The measurer of FIG. 1 may include a single electrochemical impedance device and a single cell performance measurement device.

Figure 4:
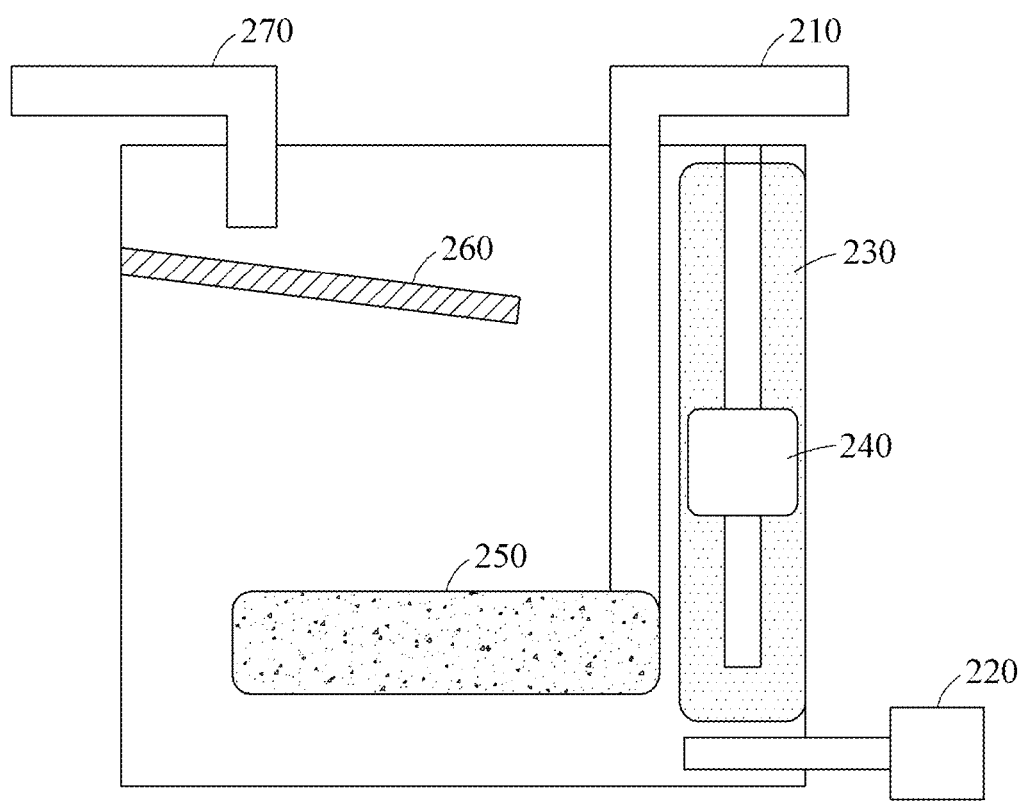
FIG. 4 is a diagram illustrating a structure of a humidifier applied to a multichannel fuel cell test station according to an example embodiment.

FIG. 4 is a diagram illustrating a structure of a humidifier applied to a multichannel fuel cell test station according to an example embodiment.

The humidifying portion may include an air humidifier. The air humidifier may include a dry gas supply 210, a water supply 220, a water gauge 230, a float 240, a porous bubble generator 250, a bubble blocking wall 260 and a wet gas discharge portion 270.

In a multichannel fuel cell test method according to an example embodiment, performances and electrochemical impedances of "2" through "12" unit cells may be simultaneously measured using a fuel cell test station according to an example embodiment.

According to example embodiments, using a multichannel fuel cell test station, it is possible to test a performance and electrochemical impedance of a fuel cell at low costs. Also, it is possible to test a plurality of unit fuel cells using a single performance test station. In addition, the multichannel fuel cell test station may require less manpower and small installation area and may facilitate a maintenance.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A multichannel fuel cell test station comprising:
    a cell mounting portion configured to receive a plurality of unit cells;
    a gas supply configured to supply fuel gas to the unit cells, the gas supply comprising a pressure generator and a mass flow controller (MFC);
    a temperature controller configured to maintain a constant ambient temperature of the unit cells;
    a humidifying portion configured to maintain a constant humidification state around the unit cells;
    a measurer configured to measure performances and electrochemical impedances of the unit cells; and
    a controller configured to control the gas supply, the temperature controller, the humidifying portion and the measurer;
    wherein the pressure generator comprises:
    a top plate comprising an inlet and an outlet penetrating through the pressure generator; and
    a bottom plate comprising a flow path formed to allow the fuel gas to move, and
    wherein the inlet is connected to an end of the flow path, the outlet is connected to another end of the flow path, and the fuel gas flows from the inlet to the outlet by passing through the flow path.

2. The multichannel fuel cell test station of claim 1, wherein a single MFC and the same number of pressure generators as a number of the unit cells are provided.

3. The multichannel fuel cell test station of claim 1, wherein the pressure generator is formed in a front end of each of the unit cells.

4. The multichannel fuel cell test station of claim 1, wherein a pressure of the fuel gas at the end is higher than a pressure of the fuel gas at the other end.

5. The multichannel fuel cell test station of claim 1, wherein the flow path comprises a zigzag groove formed between the ends.

6. The multichannel fuel cell test station of claim 1, wherein the gas supply is configured to supply gas comprising at least one selected from the group consisting of air, hydrogen, nitrogen and oxygen.

7. The multichannel fuel cell test station of claim 1, wherein the measurer comprises a magnetic contactor.

8. The multichannel fuel cell test station of claim 1, wherein the measurer comprises an electrochemical impedance device and a single unit cell performance measurement device.

9. The multichannel fuel cell test station of claim 1, wherein the humidifying portion comprises an air humidifier, and
   wherein the air humidifier comprises a water supply, a dry gas supply, a porous bubble generator, a bubble blocking wall and a wet gas discharge portion.

10. A multichannel fuel cell test method of simultaneously measuring performances and electrochemical impedances of 2 through 12 unit cells using the multichannel fuel cell test station of claim 1.

* * * * *